(12) United States Patent
Igarashi

(10) Patent No.: US 8,835,772 B2
(45) Date of Patent: Sep. 16, 2014

(54) PRODUCTION METHOD OF CONNECTION STRUCTURE

(75) Inventor: Satoshi Igarashi, Tochigi (JP)

(73) Assignee: Dexerials Corporation, Tokyo (JP)

( * ) Notice: Subject to any disclaimer, the term of this patent is extended or adjusted under 35 U.S.C. 154(b) by 273 days.

(21) Appl. No.: 13/515,425

(22) PCT Filed: Jun. 3, 2011

(86) PCT No.: PCT/JP2011/062779

§ 371 (c)(1),
(2), (4) Date: Jun. 12, 2012

(87) PCT Pub. No.: WO2011/158666

PCT Pub. Date: Dec. 22, 2011

(65) Prior Publication Data

US 2012/0255766 A1    Oct. 11, 2012

(30) Foreign Application Priority Data

Jun. 15, 2010  (JP) .................................. 2010-136180

(51) Int. Cl.
*H05K 1/02* (2006.01)
*B23K 1/00* (2006.01)
(Continued)

(52) U.S. Cl.
CPC .. *H01R 43/0242* (2013.01); *H01L 2224/83855* (2013.01); *H01L 2924/0133* (2013.01); *H01L 24/83* (2013.01); *C08G 2650/56* (2013.01);
(Continued)

(58) Field of Classification Search
USPC ................................ 174/257, 259, 266, 261;
228/175–179.1; 29/830, 843; 428/198, 428/940; 438/118, 612, 613; 361/760, 767, 361/768, 782, 783
See application file for complete search history.

(56) References Cited

U.S. PATENT DOCUMENTS 5,965,064 A * 10/1999 Yamada et al. ................ 252/512
8,486,212 B2 * 7/2013 Hamazaki ..................... 156/228

(Continued)

FOREIGN PATENT DOCUMENTS

JP    A-8-186156    7/1996
JP    A-8-325543    12/1996
(Continued)

OTHER PUBLICATIONS

International Preliminary Report on Patentability issued in International Patent Application No. PCT/JP2011/062779 dated Jan. 15, 2013 (with translation).

(Continued)

*Primary Examiner* — Hoa C Nguyen
(74) *Attorney, Agent, or Firm* — Oliff PLC

(57) ABSTRACT

In order to lower the substantial heating temperature of a thermosetting adhesive and to realize favorable connection reliability during connecting an electrical element to a circuit board by anisotropic conductive connection with using solder particles, a product in which solder particles having a melting temperature Ts are dispersed in an insulating acrylic-based thermosetting resin having a minimum melt viscosity temperature Tv is used as an anisotropic conductive adhesive in producing a connection structure by connecting the circuit board and the electrical element to each other by anisotropic conductive connection.

8 Claims, 1 Drawing Sheet

(51) Int. Cl.
*B32B 27/14* (2006.01)
*H01L 23/00* (2006.01)
*C09J 163/00* (2006.01)
*H05K 3/32* (2006.01)
*C09J 171/00* (2006.01)
*H01R 43/02* (2006.01)
*C09J 163/10* (2006.01)
*C08F 230/08* (2006.01)
*H01R 4/04* (2006.01)

(52) U.S. Cl.
CPC ............... *H01L 2224/2929* (2013.01); *H01L 2924/09701* (2013.01); *C08F 2230/085* (2013.01); *H01L 2924/0103* (2013.01); *H01L 2924/0781* (2013.01); *H01L 2924/01045* (2013.01); *H01L 2224/29101* (2013.01); *C09J 163/00* (2013.01); *H01L 2924/0665* (2013.01); *H01L 2224/2919* (2013.01); *H01L 2924/01049* (2013.01); *H01L 24/29* (2013.01); *H05K 3/323* (2013.01); *H01L 2924/01047* (2013.01); *H01R 4/04* (2013.01); *H01L 2924/01033* (2013.01); *H01L 2924/014* (2013.01); *H01L 2924/01322* (2013.01); *H01L 2924/01004* (2013.01); *C09J 171/00* (2013.01); *H01L 2924/01023* (2013.01); *H01L 2224/29311* (2013.01); *H01L 2224/293* (2013.01); *H01L 2924/01082* (2013.01); *C09J 163/10* (2013.01); *H01L 2224/29313* (2013.01); *H01L 2924/01006* (2013.01); *H01L 2924/01013* (2013.01); *H01L 2224/29109* (2013.01); *H01L 2924/01029* (2013.01); *H01L 2924/0132* (2013.01); *H01L 2924/0105* (2013.01); *H05K 2203/0425* (2013.01); *H01L 2924/01079* (2013.01); *H01L 2224/29111* (2013.01); *H01L 2924/01005* (2013.01)
USPC ........... 174/259; 228/175; 428/198; 438/118; 29/843

(56) References Cited

U.S. PATENT DOCUMENTS

| | | | |
|---|---|---|---|
| 2008/0165518 A1* | 7/2008 | Ichiryu et al. | 361/803 |
| 2009/0161328 A1* | 6/2009 | Sakai et al. | 361/760 |
| 2009/0203169 A1* | 8/2009 | Tomita et al. | 438/108 |
| 2010/0103630 A1* | 4/2010 | Tanaka et al. | 361/749 |
| 2011/0221075 A1* | 9/2011 | Meura et al. | 257/779 |
| 2011/0249417 A1* | 10/2011 | Kawabata | 361/760 |

FOREIGN PATENT DOCUMENTS

| | | |
|---|---|---|
| JP | A-2003-147287 | 5/2003 |
| JP | B2-3966516 | 8/2007 |

OTHER PUBLICATIONS

Dec. 3, 2013 Japanese Office Action issued in Japanese Application No. 2010-136180 (with translation).
International Search Report issued in International Patent Application No. PCT/JP2011/062779 dated Aug. 2, 2011.

* cited by examiner

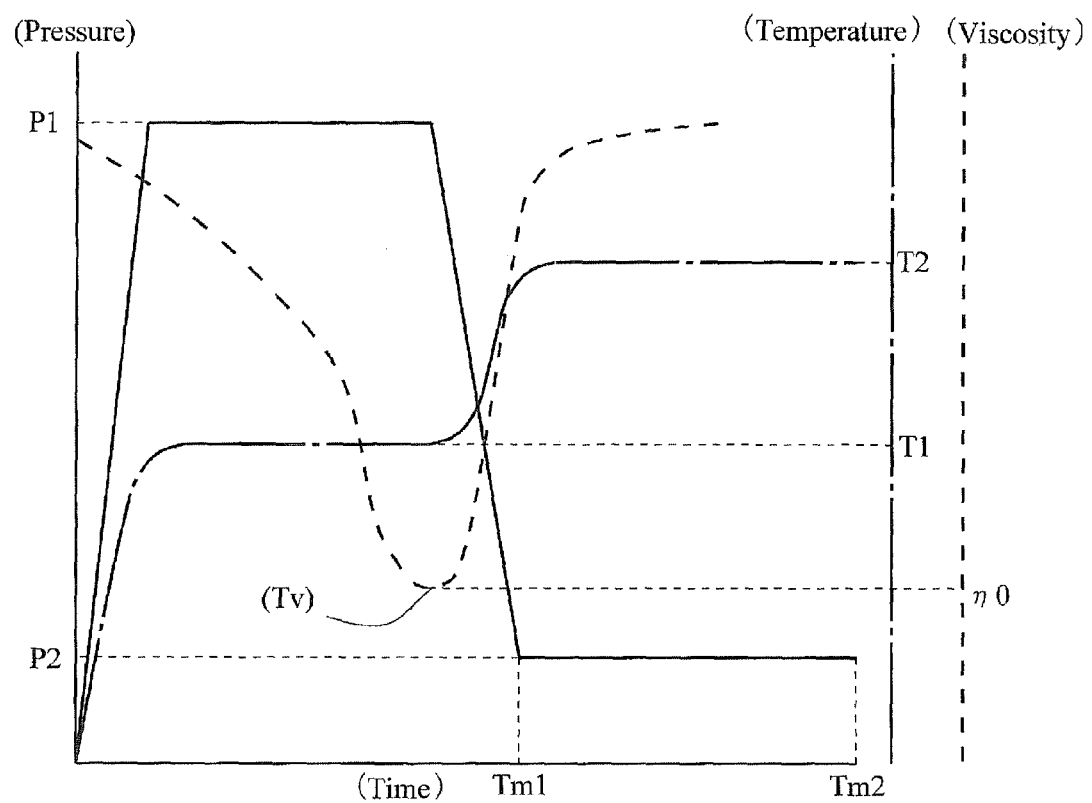

PRODUCTION METHOD OF CONNECTION STRUCTURE

TECHNICAL FIELD

The present invention relates to a method for producing a connection structure in which an electrode of a circuit board and an electrode of an electrical element are connected to each other by anisotropic conductive connection.

BACKGROUND ART

It has been proposed that, when a bump of an electrical element such as a semiconductor chip is connected to an electrode of a circuit board by anisotropic conductive connection, an anisotropic conductive film, in which solder particles having a melting temperature of 180 to 185° C. are dispersed in an epoxy-based thermosetting adhesive having a curing temperature of 195 to 200° C., is disposed between the bump of the semiconductor chip and the electrode of the circuit board, and then the obtained product is heated and pressurized so that the solder particles are melted, thereby metallically bonding the bump of the semiconductor chip and the electrode of the circuit board (Patent Literature 1). In this case, preheating is performed at a temperature between 120 to 130° C. so that the epoxy-based thermosetting adhesive is cured to some extent so as to regulate a range in which the solder flows when melted, and then substantial heating is performed at a temperature between 200 to 210° C. so that the solder particles are melted.

CITATION LIST

Patent Literature

[Patent Literature 1] Japanese Patent Application Laid-Open No. Hei. 8-186156

SUMMARY OF INVENTION

Problem(s) to be Solved by the Invention

However, in the case of Patent Literature 1, there has been a problem that a high temperature of the substantial heating between 200 to 210° C. would damage the semiconductor chip. For this reason, the substantial heating is required to be performed at a lower temperature. Furthermore, even in that case, it is required that a short between neighboring terminals be prevented from occurring, and that connection reliability be prevented from being reduced in a heat shock cycle test or a high temperature and high humidity test.

An object of the present invention is to solve the above problems associated with the prior art, and to set the substantial heating temperature of the insulating thermosetting adhesive used as a dispersion medium for solder particles to a relatively low temperature when connecting an electrical element to a circuit board by anisotropic conductive connection via a metallic bond with using solder particles, so that a short between neighboring terminals is prevented from occurring and good connection reliability can be realized.

Means for Solving the Problem(s)

The inventor has conducted an extensive research in order to achieve the above objects, and as a result, has found that: low temperature melting solder particles such as Sn—Bi based solder particles are used as solder particles; an acrylic-based anisotropic conductive adhesive which is curable at a relatively low temperature is used; and there is a certain magnitude relationship among a melting temperature of the solder particles, a temperature at which the acrylic-based anisotropic conductive adhesive shows a minimum melt viscosity, a preheating temperature, and a substantial heating temperature, as well as between a preheating pressure and a substantial heating pressure. Based on such knowledge, the present invention has been completed.

That is, the present invention provides a production method of a connection structure in which an electrode of a circuit board and an electrode of an electrical element are connected to each other by anisotropic conductive connection, and a connection structure produced by the production method. The production method includes a heating and pressurizing step of connecting the electrode of the circuit board and the electrode of the electrical element by placing the electrical element on the circuit board via an anisotropic conductive adhesive, and heating and pressurizing the placed electrical element, wherein a product formed by dispersing solder particles having a melting temperature Ts in an insulating acrylic-based thermosetting resin is used as the anisotropic conductive adhesive, and a temperature at which the anisotropic conductive adhesive shows a minimum melt viscosity is Tv, the following formulas (1) and (2) are satisfied when:

the heating and pressurizing step includes a first heating and pressurizing step and a subsequent second heating and pressurizing step;

a heating temperature in the first heating and pressurizing step is defined as T1, and an applied pressure in the step is defined as P1; and a heating temperature in the second heating and pressurizing step is defined as T2, and an applied pressure in the step is defined as P2, in the first heating and pressurizing step, the anisotropic conductive adhesive is melted and caused to flow to be pressed out from a gap between the circuit board and the electrical element, and further to be precured, and in the second heating and pressurizing step, the solder particles are melted to form a metallic bond between the electrode of the circuit board and the electrode of the electrical element and to substantially cure the anisotropic conductive adhesive.

$$Tv<T1<Ts<T2 \quad (1)$$

$$P1>P2 \quad (2)$$

Advantageous Effects of Invention

The production method of the present invention uses low temperature melting solder particles as conductive particles constituting an anisotropic conductive adhesive, and low temperature curable acrylic-based thermosetting resin, instead of an epoxy-based thermosetting adhesive, as an insulating thermosetting adhesive constituting an anisotropic conductive adhesive. Moreover, a specific magnitude relationship is set among a melting temperature of the solder particles, a temperature at which the anisotropic conductive adhesive shows a minimum melt viscosity, a preheating temperature, and a substantial heating temperature, as well as between a preheating pressure and a substantial heating pressure. Therefore, when connecting an electrical element to a circuit board by anisotropic conductive connection via a metallic bond with using the solder particles, the substantial heating temperature of the insulating thermosetting adhesive which becomes a dispersion medium for the solder particles can be set to a relatively low temperature (for example, 150 to 170° C.), thereby preventing a short between the neighboring terminals from occurring and realizing favorable connection reliability.

BRIEF DESCRIPTION OF DRAWINGS

FIG. 1 is an illustrative view of the heating and pressurizing step of the present invention.

DESCRIPTION OF EMBODIMENTS

The present invention is a production method of a connection structure in which an electrode of a circuit board and an electrode of an electrical element are connected to each other by anisotropic conductive connection. The production method includes a heating and pressurizing step of connecting the electrode of the circuit board and the electrode of the electrical element by placing the electrical element on the circuit board via an anisotropic conductive adhesive, and heating and pressurizing the placed electrical element.

<Heating and Pressurizing Step>

In the present invention, the heating and pressurizing step includes a first heating and pressurizing step and a subsequent second heating and pressurizing step. FIG. 1 shows a graph illustrating a change of each of a temperature T (a dashed line) and a pressure P (a solid line), and a melt viscosity η (a dotted line) of the anisotropic conductive adhesive, with respect to time.

The first heating and pressurizing step is a step of heating the anisotropic conductive adhesive existing between the circuit board and the electrical element to a temperature equal to or higher than a temperature at which the adhesive shows a minimum melt viscosity η0 (i.e., a minimum melt viscosity temperature Tv), so that the anisotropic conductive adhesive is caused to flow and an excess of the anisotropic conductive adhesive is pressed out and removed from therebetween. Therefore, solder particles are not melted in this step. Also, the anisotropic conductive adhesive is melted and caused to flow, so that part of the anisotropic conductive adhesive is cured. In this case, the curing rate of the anisotropic conductive adhesive in the first heating and pressurizing step is 8 to 80%, and more preferably 10 to 60%. As a result, as shown in FIG. 1, the anisotropic conductive adhesive shows a minimum melt viscosity, and thereafter the viscosity gradually increases. Here, the curing rate is a numerical value defined by a decrease of a characteristic absorption attributable to olefins of an acrylic-based compound as measured by infrared spectrophotometry.

In the second heating and pressurizing step, a heating temperature is increased from T1 to T2 subsequent to the first heating and pressurizing step. Accordingly, the solder particles are heated to a temperature equal to or higher than a melting temperature Ts thereof, so that the solder particles are melted to metallically bond the electrode of a circuit board and the electrode of an electrical element while substantially curing the anisotropic conductive adhesive. The curing rate of the anisotropic conductive adhesive is preferably 80% or greater, and ideally 100%.

Also, in the present invention, an applied pressure P2 in the second heating and pressurizing step is set lower than an applied pressure P1 in the first heating and pressurizing step. The reason for this is to efficiently remove voids from between microscopic circuit patterns of the circuit board connected via the anisotropic conductive adhesive. That is, excessively low melt viscosity of the anisotropic conductive adhesive makes it hard to push out the voids remained between the microscopic circuit patterns of the circuit board from the adhesive present between the circuit board and the electrical element. Therefore, the voids need to be pushed out while the melt viscosity of the adhesive is still relatively high. Therefore, the pressure in the first heating and pressurizing step needs to be set higher. On the other hand, when a thermosetting resin in the adhesive is substantially cured after the voids are pushed out, an excessively high pressure may cause the applied pressure to be concentrated on the electrode (for example, a gold plated bump) of the electrical element (for example, a semiconductor chip) in addition to shrinkage of the resin attributable to curing, thereby deforming the microscopic circuit patterns of the circuit board. Therefore, the applied pressure P2 in the second heating and pressurizing step is set to be lower than the applied pressure P1 in the first heating and pressurizing step.

Thus, according to the present invention, the temperature and the pressure in the heating and pressurizing step need to satisfy a relationship of the following formulas (1) and (2).

$$Tv < T1 < Ts < T2 \quad (1)$$

$$P1 > P2 \quad (2)$$

In the present invention, there is concern that an excessively low minimum melt viscosity temperature Tv of the anisotropic conductive adhesive makes it difficult to form a membrane (a film), while an excessively high minimum melt viscosity temperature Tv causes solder to be melted. Therefore, the minimum melt viscosity temperature Tv is preferably 70 to 150° C., and more preferably 80 to 120° C.

There is concern that an excessively low heating temperature T1 in the first heating and pressurizing step reduces flowability of the anisotropic conductive adhesive, while an excessively high heating temperature T1 causes solder to be melted. Therefore, the heating temperature T1 is preferably 80 to 160° C., and more preferably, 90 to 130° C.

There is concern that an excessively low melting temperature Ts of solder particles reduces connection reliability, while an excessively high melting temperature Ts prevents a metallic bond from being formed during thermo-compression bonding. Therefore, the temperature Ts is preferably 100 to 210° C., and more preferably 130 to 170° C.

There is concern that an excessively low heating temperature T2 in the second heating and pressurizing step prevents the solder from being melted, while an excessively high heating temperature T2 causes the anisotropic conductive adhesive to be subjected to springback (peeling). Therefore, the heating temperature T2 is preferably 130 to 220° C., and more preferably 130 to 190° C.

An excessively small difference between T1 and Tv is likely to cause insufficient press during thermo-compression bonding, while an excessively large difference between T1 and Tv is likely to cause excessive curing of the anisotropic conductive adhesive, thereby leading to insufficient press during thermo-compression bonding. Therefore, the difference between T1 and Tv is preferably 10 to 40° C., and more preferably 10 to 30° C.

An excessively small difference between Ts and T1 causes melting of the solder to occur in the first heating and pressurizing step thereby causing a short, while an excessively large difference between Ts and T1 lengthens a tact time of the compression bonding step itself, thereby reducing production efficiency. Therefore, the difference between Ts and T1 is preferably 2 to 110° C., and more preferably 10 to 30° C.

An excessively small difference between T2 and Ts causes the solder to be insufficiently melted, while an excessively large difference between T2 and Ts requires time to increase the temperature thereby lengthening a tact time of the compression bonding step itself to reduce production efficiency. Therefore, the difference between T2 and Ts is preferably 2 to 100° C., and more preferably 10 to 50° C.

In the production method according to the present invention, regarding a timing of switching of the applied pressure from P1 to P2, the switching is preferably initiated at a temperature ranging from −10° C. to +10° C. of the minimum melt viscosity temperature Tv of the anisotropic conductive adhesive, since a voidless connection structure can be achieved. Also, it is preferable that the applied pressure P1 reach the applied pressure P2 while the temperature reaches the minimum melt viscosity temperature Tv plus 40° C. (i.e., at the time of Tm1 in FIG. 1), in view of being capable of achieving low pressure connection. The second heating and pressurizing step is completed at the time of Tm2 in FIG. 1.

<Anisotropic Conductive Adhesive>

The production method of the present invention, as an anisotropic conductive adhesive used for anisotropic conductive connection, uses a product prepared by dispersing solder particles having a melting temperature Ts in an insulating acrylic-based thermosetting resin having a minimum melt viscosity temperature Tv, and formed it into a paste or film-shaped product.

The solder particles function as conductive particles for anisotropic conductive connection. The melting temperature Ts of the solder particles is relatively low, preferably 130 to 210° C., and more preferably 130 to 170° C. In terms of a component, a lead-free solder is preferably used. Specifically, examples of the lead-free solder include an Sn—Cd based solder, for example, an Sn(67%)-Cd(33%) eutectic solder (Ts=176° C.) and an Sn(60%)-Cd(40%) eutectic solder (Ts=144° C.); an Sn—Bi based solder, for example, an Sn(42%)-Bi(58%) eutectic solder (Ts=138° C.), an Sn(40%)-Bi(56%)-Zn(4%) eutectic solder (Ts=130° C.), and an Sn(25.9%)-Bi(53.9%)-Cd(20.2%) eutectic solder (Ts=103° C.); and an Sn—In based solder, for example, an Sn(48%)—In(52%) eutectic solder (Ts=117° C.) and an Sn(17.3%)-Bi(57.5%)-In(25.2%) eutectic solder (Ts=78.8° C.).

An excessively small average particle size of the solder particles is likely to fail to contribute to connection, while an excessively large average particle size of the solder particles is likely to cause a short to occur between the connected terminals. Therefore, the average particle size of the solder particles is preferably 1 to 70 μm, and more preferably 2 to 40 μm.

An excessively small amount of the solder particles in the anisotropic conductive adhesive is likely to cause connection defect, while an excessively large amount of the solder particles in the anisotropic conductive adhesive is likely to cause a short to occur between the neighboring terminals. Therefore, the amount of the solder particles with respect to 100 parts by mass of a resin solid component (i.e., a combined amount of a curable acrylic-based compound and a film-forming resin) is preferably 1 to 50 parts by mass, and more preferably 2 to 30 parts by mass.

The insulating acrylic-based thermosetting resin constituting an anisotropic conductive adhesive includes at least a curable acrylic-based compound, a thermosetting initiator, and a film-forming resin. Here, the curable acrylic-based compound is a compound having one or more, preferably two, of an acroyl group or a methacroyl group (hereinafter collectively referred to as a (meta)acroyl group). Here, the number of (meta)acroyl groups in one molecule of the curable acrylic-based compound is two or more, preferably two, in order to improve conduction reliability.

Specific examples of the curable acrylic-based compound include polyethylene glycol diacryl, phosphate ester type acrylate, 2-hydroxyethyl acrylate, 2-hydroxypropyl acrylate, 4-hydroxybutyl acrylate, isobutyl acrylate, t-butyl acrylate, isooctyl acrylate, bis-phenoxyethanol fluorene diacrylate, 2-acryloyloxy ethyl succinate, lauryl acrylate, stearyl acrylate, isobornyl acrylate, tricyclodecane dimethanol dimethacrylate, cyclohexyl acrylate, tris(2-hydroxyethyl) isocyanurate triacrylate, tetrahydrofurfuryl acrylate, o-phthalic acid diglycidyl ether acrylate, ethoxylated bisphenol A dimethacrylate, bisphenol A type epoxy acrylate, urethane acrylate, epoxy acrylate, and (meth)acrylates corresponding thereto.

Also, in order to obtain high adhesive strength and conductive reliability, 5 to 40 parts by mass of a bifunctional acrylate, 10 to 40 parts by mass of urethane acrylate, and 0.5 to 5 parts by mass of phosphate ester type acrylate are preferably combined with these ratios as the curable acrylic-based compound. Here, the bifunctional acrylate is formulated in order to improve cohesion of a cured product and to improve conductive reliability; the urethane acrylate is formulated in order to improve adhesion to polyimide; and the phosphate ester type acrylate is formulated in order to improve adhesion to metal.

An excessively small formulating amount of the curable acrylic-based compound in the acrylic-based thermosetting resin is likely to reduce conductive reliability, while an excessively large formulating amount is likely to reduce adhesive strength. Therefore, the formulating amount of the curable acrylic-based compound is preferably 20 to 70% by mass of the resin solid component (the combined amount of a curable acrylic-based compound and a film-forming resin), and more preferably 30 to 60% by mass thereof.

As the film-forming resin, for example, a thermoplastic elastomer such as a polyester resin, a polyurethane resin, a phenoxy resin, polyamide, and an EVA may be used. Among these, in view of heat resistance and adhesion, a polyester resin, a polyurethane resin, and a phenoxy resin can be preferably used. Examples of a preferred phenoxy resin include a bisphenol-A type phenoxy resin and a fluorene backbone-containing phenoxy resin.

As the thermosetting initiator, an organic peroxide or an azo compound, which generates radicals due to pyrolysis, may be used. Examples of the organic peroxide include diisobutyryl peroxide, 1,1,3,3-tetramethylbutyl peroxy-2-ethylhexanoate, dilauroyl peroxide, di(3,5,5-trimethyl hexanoyl)peroxide, t-butyl peroxypivalate, t-hexyl peroxypivalate, t-butyl peroxyneoheptanoate, t-butyl peroxyneodecanoate, t-hexyl peroxyneodecanoate, di(2-ethylhexyl)peroxydicarbonate, di(4-t-butylcyclohexyl)peroxydicarbonate, 1,1,3,3-tetramethylbutyl peroxyneodecanoate, di-sec-butyl peroxydicarbonate, di-n-propyl peroxydicarbonate, and cumyl peroxyneodecanoate. Two or more of these can be combined for use. Examples of the azo compound include azobisbutyronitrile.

An excessively small amount of the thermosetting initiator used in the anisotropic conductive adhesive is likely to nullify reactivity, while an excessively large amount used is likely to reduce cohesion of the anisotropic conductive film. Therefore, the amount used of the thermosetting initiator is preferably 1 to 10 parts by mass, and more preferably 3 to 7 parts by mass with respect to 100 parts by mass of the curable acrylic-based compound.

The anisotropic conductive adhesive used in the present invention can be prepared by uniformly mixing and dispersing the above solder particles in the insulating acrylic-based thermosetting adhesive, together with a solvent such as toluene as necessary, and then forming as a paste or into a film in accordance with a routine method. Furthermore, the anisotropic conductive adhesive may include a silane coupling agent, a gum component, fillers such as inorganic fillers, and various additives.

<Circuit Board, Electrical Element, and Others>

A conventionally-known circuit board, electrical element, and electrode can be used as those to which the production method of the present invention can be applied. For instance, examples of the circuit board include a glass substrate, a ceramics substrate, a polyimide flexible substrate, and a silicon substrate. Also, examples of the electrode include a metal electrode such as copper, aluminum, silver, and gold; and a metal composite oxide electrode such as an ITO. In this case, the shape of the electrode is not particularly limited, and the electrode may be shaped into a pad or a bump. Also, as the electrical element, various electrical elements can be used. Examples of such an electrical element include a semiconductor element such as a bare chip, a chip size package, and an IC module; an optical element such as an LED; and a flexible circuit board. The electrode for the electrical elements may also be shaped in a pad or a bump.

In the connection structure produced by the production method of the present invention, anisotropic conductive connection is established between the electrode of a circuit board and the electrode of an electrical element by the prescribed heating and pressurizing step via the anisotropic conductive adhesive, in which low temperature melting solder particles are dispersed in a low temperature curable acrylic-based thermosetting resin. Therefore, favorable connection reliability can be realized.

EXAMPLES

The present invention will be specifically described below by way of examples.

Examples 1 and 2, and Comparative Examples 1 to 5

First, anisotropic conductive adhesives A and B were prepared as described below.

(Anisotropic Conductive Film A)

30 parts by mass of a bis-A type phenoxy resin (YP50 manufactured by Nippon Steel Chemical Co., Ltd.), 30 parts by mass of a liquid acrylic compound (EB3701 manufactured by DAICEL-CYTEC Company LTD.), an organic peroxide curing agent (Perocta O manufactured by NOF CORPORATION), 1 part by mass of an acrylic-based silane coupling agent (A-172 manufactured by Momentive Performance Materials Inc.) were mixed. Furthermore, an eutectic SnBi solder having an average particle size of 10 μm and a melting temperature of 138° C. was added so that an amount of the solder becomes 20% by mass in a resin solid component. Then, toluene was added to prepare an anisotropic conductive composition having a solid amount of 50 wt %. The prepared anisotropic conductive composition was coated on a release treated PET by using a bar coater, and dried in an oven at 70° C. for 5 minutes to prepare a 35 μm thick anisotropic conductive film.

(Anisotropic Conductive Film B)

An anisotropic conductive film B was prepared in the same manner as the anisotropic conductive film A, except that an eutectic SnBi solder in the anisotropic conductive film A was replaced by an eutectic SnIn solder.

(Production of Connection Structure)

A circuit board (terminal conductive pattern width: 50 μm, pattern pitch: 100 μm), the anisotropic conductive film A or B, and further a flexible circuit board (terminal conductive pattern width: 50 μm, pattern pitch: 100 μm) were stacked on a flat board set at 40° C., and then heated and pressurized under the conditions in Table 1 to prepare a connection structure.

(Evaluation)

The obtained connection structure was examined on presence or absence of occurrence of a short between the neighbors (charged at 30 V for 1 minute), a treatment time of a pressure cooker (PCT (60° C., 95% RH)) capable of ensuring a moisture resistance (30° C., 70% RH, 168 hours) equivalent to level 3 under Jedec, and the number of cycles of a heat shock treatment (H/S (−55° C. (15 minutes) and 125° C. (15 minutes))). The obtained results are shown in Table 1.

TABLE 1

| | Heating and pressurizing step | Anisotropic conductive film | Minimum melt viscosity temperature Tv (° C.) | Solder melting temperature Ts (° C.) | Heating and pressurizing step Pressure (Mpa) | Temperature (° C.) | Time (sec) | Short between neighboring terminals | H/S (cycles) | PCT treatment time (hr) | Remarks |
|---|---|---|---|---|---|---|---|---|---|---|---|
| Comparative example 1 | Constant | A | 89 | 138 | 0.5 | 190 | 6 | Absence | Initial NG | Initial NG | Insufficient press |
| Comparative example 2 | Constant | A | 89 | 138 | 3.0 | 190 | 6 | Presence | — | — | Short attributable to fusion bonding of solder particles |
| Comparative example 3 | Constant | B | 89 | 117 | 0.5 | 135 | 6 | Absence | 50 | <500 | No metallic bond of particles |
| Comparative example 4 | Constant | B | 89 | 117 | 0.5 | 190 | 6 | Absence | Initial NG | Initial NG | Insufficient press |
| Comparative example 5 | First heating and pressurizing P1, T1 | A | 89 | 138 | 0.5 | 100 | 3 | Presence | — | — | Short attributable to fusion bonding of solder particles |
| | Second heating and pressurizing P2, T2 | | | | 0.5 | 180 | 3 | | | | |
| Example 1 | First heating and pressur- | B | 89 | 117 | 0.5 | 100 | 3 | Absence | <500 | <500 | Very good |

TABLE 1-continued

| Heating and pressurizing step | | Anisotropic conductive film | Minimum melt viscosity temperature Tv (° C.) | Solder melting temperature Ts (° C.) | Heating and pressurizing step | | | Short between neighboring terminals | H/S (cycles) | PCT treatment time (hr) | Remarks |
|---|---|---|---|---|---|---|---|---|---|---|---|
| | | | | | Pressure (Mpa) | Temperature (° C.) | Time (sec) | | | | |
| | izing P1, T1 Second heating and pressurizing P2, T2 | | | | 0.3 | 150 | 3 | | | | |
| Example 2 | First heating and pressurizing P1, T1 | A | 89 | 138 | 0.5 | 100 | 6 | Absence | <500 | <500 | Very good |
| | Second heating and pressurizing P2, T2 | | | | 0.3 | 170 | 3 | | | | |

As clearly shown in Table 1, in the case of Examples 1 and 2 which satisfy the formulas (1) and (2), a substantial compression bonding is possible at a relatively low temperature of 150° C. or 170° C. Also, a short between the neighboring terminals was not observed in the obtained connection structure. Furthermore, as a result of a metallic bond formed therebetween, favorable reliability was exhibited.

On the other hand, in the case of Comparative Example 1, the heating and pressurizing step was not performed in two stages with a heating temperature of 190° C. and a constant pressure at a low level (0.5 MPa), thereby causing insufficient press. Accordingly, although a short did not occur between the neighboring terminals, a problem was found in the results of a reliability test. In the case of Comparative Example 2, the heating and pressurizing step was not performed in two stages with a constant pressure at a high level (3.0 MPa) and a heating temperature of 190° C. Therefore, a short attributable to a fusion bonding of the solder particles occurred between the neighboring terminals. In the case of Comparative Example 3, in which an anisotropic conductive film B was used, the heating temperature was lower than the melting temperature of the solder particles. Therefore, formation of a metallic bond by the solder particles was not observed. In the case of Comparative Example 4, in which Comparative Example 1 was repeated except that an anisotropic conductive film B was used, unfavorable results was obtained similarly to those in Comparative Example 1. In the case of Comparative Example 5, in which heating was performed in two stages, the pressure was constant and the heating temperature in the second heating and pressurizing step was 180° C. Therefore, a short attributable to a fusion bonding of the solder particles occurred between the neighboring terminals.

INDUSTRIAL APPLICABILITY

The production method of the present invention uses low temperature melting solder particles as conductive particles constituting an anisotropic conductive adhesive, and low temperature curable acrylic-based thermosetting resin as an insulating thermosetting adhesive constituting an anisotropic conductive adhesive. Moreover, a certain magnitude relationship is set among a melting temperature of the solder particles, a minimum melt viscosity temperature of the anisotropic conductive adhesive, a preheating temperature, and a substantial heating temperature, as well as between a preheating pressure and a substantial heating pressure. Therefore, when connecting an electrical element with a circuit board by anisotropic conductive connection via a metallic bond with using solder particles, the substantial heating temperature of the insulating thermosetting adhesive which becomes a dispersion medium for the solder particles can be set at a relatively low temperature (for example, 150 to 170° C.) thereby preventing a short between neighboring terminals and realizing favorable connection reliability.

The invention claimed is:

1. A method for producing a connection structure in which an electrode of a circuit board and an electrode of an electrical element are connected to each other by anisotropic conductive connection, the method comprising a heating and pressurizing step of connecting the electrode of the circuit board and the electrode of the electrical element by placing the electrical element on the circuit board via an anisotropic conductive adhesive, and heating and pressurizing the placed electrical element, wherein a product formed by dispersing solder particles having a melting temperature Ts in an insulating acrylic-based thermosetting resin is used as the anisotropic conductive adhesive, and a temperature at which the anisotropic conductive adhesive shows a minimum melt viscosity is Tv, the following formulas (1) and (2) are satisfied $$Tv<T1<Ts<T2 \qquad (1)$$

$$P1>P2 \qquad (2)$$

when:

the heating and pressurizing step includes a first heating and pressurizing step and a subsequent second heating and pressurizing step;

a heating temperature in the first heating and pressurizing step is defined as T1, and an applied pressure in the step is defined as P1; and a heating temperature in the second heating and pressurizing step is defined as T2, and an applied pressure in the step is defined as P2, in the first heating and pressurizing step, the anisotropic conductive adhesive is melted and caused to flow to be pressed out from a gap between the circuit board and the electrical element, and further to be precured, and in the second heating and pressurizing step, the solder particles are melted to form a metallic bond between the electrode of the circuit board and the electrode of the electrical element and to substantially cure the anisotropic conductive adhesive.

2. The production method according to claim 1, wherein the temperature Tv at which the anisotropic conductive adhesive shows a minimum melt viscosity is 70 to 150° C., the heating temperature T1 in the first heating and pressurizing step is 80 to 160° C., the melting temperature Ts of the solder particles is 100 to 210° C., and the heating temperature T2 in the second heating and pressurizing step is 130 to 220° C.

3. The production method according to claim 2, wherein a difference between T1 and Tv is 10 to 40° C., a difference between Ts and T1 is 2 to 110° C., and a difference between T2 and Ts is 2 to 100° C.

4. The production method according to claim 2, wherein the solder particles are eutectic SnBi solder particles or eutectic SnIn solder particles.

5. The production method according to claim 3, wherein the solder particles are eutectic SnBi solder particles or eutectic SnIn solder particles.

6. The production method according to claim 1, wherein a difference between T1 and Tv is 10 to 40° C., a difference between Ts and T1 is 2 to 110° C., and a difference between T2 and Ts is 2 to 100° C.

7. The production method according to claim 3, wherein the solder particles are eutectic SnBi solder particles or eutectic SnIn solder particles.

8. The production method according to claim 1, wherein the solder particles are eutectic SnBi solder particles or eutectic SnIn solder particles.

* * * * *